United States Patent
Byeon (10) Patent No.: US 9,331,687 B2
(45) Date of Patent: May 3, 2016

(54) POWER-UP CIRCUIT OF SEMICONDUCTOR APPARATUS

(71) Applicant: SK hynix Inc., Icheon-si Gyeonggi-do (KR)

(72) Inventor: Sang Jin Byeon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/444,396

(22) Filed: Jul. 28, 2014

(65) Prior Publication Data

US 2015/0326218 A1    Nov. 12, 2015

(30) Foreign Application Priority Data

May 9, 2014    (KR) .................. 10-2014-0055261

(51) Int. Cl.
*H03K 17/22* (2006.01)
*H03K 19/0185* (2006.01)

(52) U.S. Cl.
CPC ...... *H03K 17/223* (2013.01); *H03K 19/018507* (2013.01)

(58) Field of Classification Search
CPC ... H03K 17/223; H03K 17/00; H03K 17/693; H03K 17/22; H03K 17/16; H02M 1/38; H02M 1/10; H02M 1/36; H02M 1/44; G11C 16/10; G11C 16/16; G11C 16/26; G11C 16/32
USPC .......................................... 327/142, 143, 198
See application file for complete search history.

(56) References Cited

U.S. PATENT DOCUMENTS 8,547,145 B2    10/2013  Hong
2010/0194453 A1*  8/2010  Kadowaki ............ H03K 17/223
                                                        327/143

\* cited by examiner

*Primary Examiner* — John Poos
(74) *Attorney, Agent, or Firm* — William Park & Associates Ltd.

(57) ABSTRACT

A power-up circuit of a semiconductor apparatus using a plurality of external power voltages is configured to determine a stableness of the plurality of external power voltages through relative comparison of the plurality of external power voltages, and to activate a power-up signal.

6 Claims, 5 Drawing Sheets

POWER-UP CIRCUIT OF SEMICONDUCTOR APPARATUS

CROSS-REFERENCES TO RELATED APPLICATION

The present application claims priority under 35 U.S.C. §119(a) to Korean application number 10-2014-0055261 filed on May 9, 2014, in the Korean Intellectual Property Office, which is incorporated herein by reference in its entirety.

BACKGROUND

1. Technical Field

Various embodiments generally relate to a semiconductor apparatus, and more particularly, in one or more embodiments, to a power-up circuit of a semiconductor apparatus and a system using the same.

2. Related Art

In modern semiconductor memory designs, different blocks have different performance objectives, and therefore the semiconductor memory chip may use multiple voltages. The multiple voltages may be generated from different power sources. For example, one of the multiple voltages required for core may be different from another voltage required for I/O.

In general, the semiconductor apparatus determines a power-up status based on each voltage level of the multiple voltages.

However, voltage levels may vary due to the deviation of device elements such as internal resistance and capacitance. Even if each individual voltage level has been reached a predetermined level, deviations in differences of the multiple voltages may form unintended current path.

If the semiconductor apparatus determines the power-up status only based on each voltage level of the multiple voltages, the semiconductor apparatus cannot detect the deviations in differences of the multiple voltages, which may cause a latch-up in the semiconductor apparatus.

The semiconductor apparatus requires a power-up circuit for the stable power-up of multiple voltages.

SUMMARY

Various embodiments are provided to a power-up circuit of a semiconductor apparatus, which is capable of stable power-up.

In an embodiment, a power-up circuit of a semiconductor apparatus using a plurality of external power voltages may be configured to determine a stableness of the plurality of external power voltages through relative comparison of the plurality of external power voltages, and to activate a power-up signal.

In an embodiment, a power-up circuit of a semiconductor apparatus may include: a first detection portion configured to generate a first reserved power-up signal by detecting a first external power voltage, a level of which is equal to or higher than a first predetermined voltage level; a second detection portion configured to generate a second reserved power-up signal by detecting a second external power voltage, a level of which is equal to or higher than a second predetermined voltage level; a level shifter configured to generate a level shift signal by shifting the level of the first reserved power-up signal to the level of the second external power voltage; and a power-up signal generation portion configured to generate a power-up signal in response to the level shift signal and the second reserved power-up signal.

In an embodiment, a power-up circuit of a semiconductor apparatus may include: a voltage division portion configured to generate a first division voltage and a second division voltage, which are divided from a first external power voltage and a second external power voltage through a first resistance ratio and a second resistance ratio, respectively; a first comparison portion configured to use the first external power voltage as a power voltage, and to generate a first comparison signal by comparing the first division voltage with the second division voltage; a second comparison portion configured to use the second external power voltage as a power voltage, and to generate a second comparison signal by comparing the first division voltage with the second division voltage; and a power-up signal generation portion configured to generate a power-up signal in response to the first comparison signal and the second comparison signal.

In an embodiment, a power-up circuit of a semiconductor apparatus may include: a voltage division portion configured to generate a first division voltage and a second division voltage, which are divided from a first external power voltage and a second external power voltage through a first resistance ratio and a second resistance ratio, respectively; a first comparison portion configured to use the first external power voltage as a power voltage, and to generate a first comparison signal by comparing the first division voltage with the second division voltage; a second comparison portion configured to use the second external power voltage as a power voltage, and to generate a second comparison signal by comparing the first division voltage with the second division voltage; a level shifter configured to generate a level shift signal by shifting the level of the first comparison signal to the level of the second external power voltage; and a power-up signal generation portion configured to generate a power-up signal in response to the level shift signal and the second comparison signal.

In an embodiment, a system may include: a first voltage generator configured to generate a first external power voltage and provide the first external power voltage to a component that requires a power-up operation; a second voltage generator configured to generate a second external power voltage and provide the second external power voltage to the component that requires a power-up operation; and a power-up circuit configured to determine whether or not the power-up operation has been completed by measuring a difference between the first and second external power voltages.

BRIEF DESCRIPTION OF THE DRAWINGS

Features, aspects and embodiments are described in conjunction with the attached drawings, in which.

DETAILED DESCRIPTION

Semiconductor apparatus according to various embodiments will be described below with reference to the accompanying drawings.

In accordance with various embodiments, a power-up circuit of a semiconductor apparatus may determine whether a plurality of external voltages have become stable after a power-up sequence, and activate a power-up signal through relative comparison of the plurality of external voltages with each other.

Figure 1:
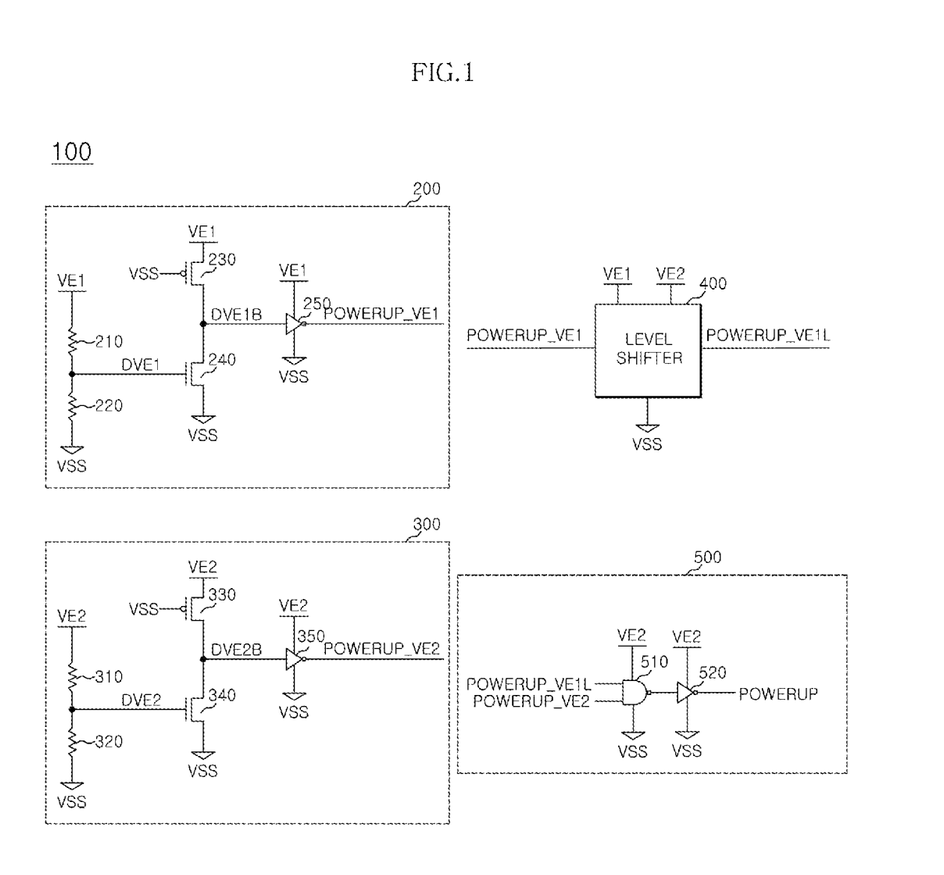
FIG. 1 is a circuit diagram illustrating a power-up circuit of a semiconductor apparatus in accordance with an embodiment.

Referring to FIG. 1, the power-up circuit 100 may include a first detection portion 200, a second detection portion 300, a level shifter 400, and a power-up signal generation portion 500.

The first detection portion 200 may generate a first reserved power-up signal POWERUP_VE1 by detecting a first external power voltage VE1. For example, the first detection portion 200 may generate the first reserved power-up signal POWERUP_VE1 having a high voltage level when the first external power voltage VE1 is equal to or higher than a first predetermined voltage level.

The first detection portion 200 may include first and second division resistances 210 and 220, a first transistor 230, a second transistor 240, and an inverter 250.

The first and second division resistances 210 and 220 may be electrically coupled between the first external power voltage VE1 and a ground voltage VSS. For example, the first and second division resistances 210 and 220 are coupled in series and the first division resistance 210 may be coupled to the first external power voltage VE1 and the second division resistance 220 may be coupled to the ground voltage VSS.

The first and second division resistances 210 and 220 may output a first division voltage DVE1 which is a fraction of the first external power voltage VE1. For example, the first division voltage DVE1 may be determined based on a first resistance ratio.

The first transistor 230 may receive the first external power voltage VE1 at its source, and the ground voltage VSS at its gate.

The second transistor 240 may receive the first division voltage DVE1 at its gate, and the ground voltage VSS at its source, and may be electrically coupled to the drain of the first transistor 230 at its drain.

The inverter 250 may invert a voltage DVE1B of a node where the drains of the first transistor 230 and the second transistor 240 are electrically coupled to each other, and output the first reserved power-up signal POWERUP_VE1.

The second detection portion 300 may generate a second reserved power-up signal POWERUP_VE2 by detecting a second external power voltage VE2. For example, the second detection portion 300 may generate the second reserved power-up signal POWERUP_VE2 having a high voltage level when the second external power voltage VE2 is equal to or higher than a second predetermined voltage level.

The second detection portion 300 may include third and fourth division resistances 310 and 320, a third transistor 330, a fourth transistor 340, and an inverter 350.

The third and fourth division resistances 310 and 320 may be electrically coupled between the second external power voltage VE2 and the ground voltage VSS. For example, the third and fourth division resistances 310 and 320 are coupled in series and the third division resistance 310 may be coupled to the second external power voltage VE2 and the fourth division resistance 320 may be coupled to the ground voltage VSS.

The third and fourth division resistances 310 and 320 may output a second division voltage DVE2 which is a fraction of the second external power voltage VE2. For example, the second division voltage DVE2 may be determined based on a second resistance ratio.

The first transistor 330 may receive the second external power voltage VE2 at its source, and the ground voltage VSS at its gate.

The second transistor 340 may receive the second division voltage DVE2 at its gate, and the ground voltage VSS at its source, and may be electrically coupled to the drain of the first transistor 330 at its drain.

The inverter 350 may invert a voltage DVE2B of a node where the drains of the first transistor 330 and the second transistor 340 are electrically coupled to each other, and output the second reserved power-up signal POWERUP_VE2.

The first resistance ratio and the second resistance ratio may be set so that the level of the first division voltage DVE1 may be higher than the level of the second division voltage DVE2.

The first resistance ratio and the second resistance ratio may be set according to the levels of the first external power voltage VE1 and the second external power voltage VE2.

The level shifter 400 may generate a level shift signal POWERUP_VE1L by shifting the level of the first reserved power-up signal POWERUP_VE1, for example, to the level of the second external power voltage VE2.

The level of the first reserved power-up signal POWERUP_VE1 may refer to the voltage level of the first external power voltage VE1.

The level shifter 400 may generate the level shift signal POWERUP_VE1L when the level of the second external power voltage VE2 becomes stable. The level of the level shift signal POWERUP_VE1L may refer to a difference between the first external power voltage VE1 and second external power voltage VE2.

The power-up signal generation portion 500 may generate a power-up signal POWERUP in response to the level shift signal POWERUP_VE1L and the second reserved power-up signal POWERUP_VE2.

The power-up signal generation portion 500 may activate the power-up signal POWERUP when both of the level shift signal POWERUP_VE1L and the second reserved power-up signal POWERUP_VE2 are activated.

The power-up signal generation portion 500 may include a NAND gate 510, and an inverter 520.

The activation of the level shift signal POWERUP_VE1L may mean that the voltage level of the first external power voltage VE1 has been reached a predetermined level and a difference between the voltage levels of the first external power voltage VE1 and the second external power voltage VE2 is a predetermined level.

The power-up signal POWERUP may be activated when each individual voltage level has been reached each predetermined level and differences between the multiple voltages are predetermined levels. For example, where a semiconductor device uses the first and second external power voltages VE1 and VE2, the power-up signal POWERUP may be activated when each voltage level of the first and second external power voltages VE1 and VE2 has been reached each predetermined level and a difference between the first and second external power voltages VE1 and VE2 is a predetermined level.

The power-up operation of a semiconductor apparatus, which uses the first external power voltage VE1 and the second external power voltage VE2 in its internal operations, may be performed according to the power-up signal POWERUP.

Figure 2:
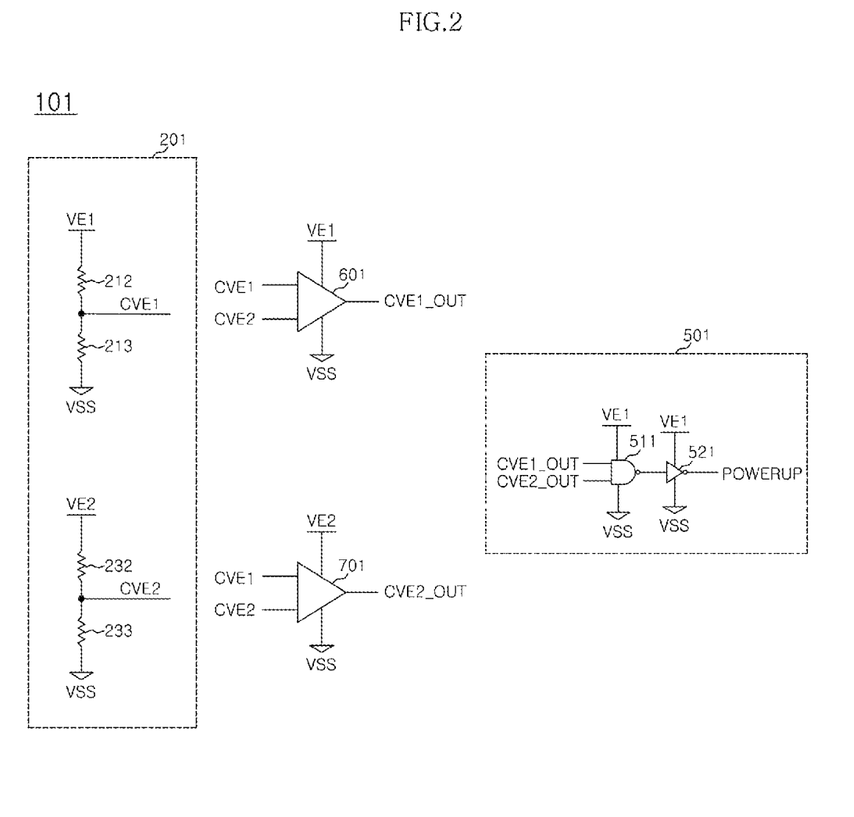
FIG. 2 is a circuit diagram illustrating a power-up circuit of a semiconductor apparatus in accordance with an embodiment.

Referring to FIG. 2, the power-up circuit 101 may include a voltage division portion 201, a first comparison portion 601, a second comparison portion 701, and a power-up signal generation portion 501.

The voltage division portion 201 may generate a first division voltage CVE1, which is a fraction of a first external power voltage VE1, and a second division voltage CVE2, which is a fraction of a second external power voltage VE2. For example, the first and second division voltages CVE1 and CVE2 may be determined based on their resistance ratios, respectively.

The voltage division portion 201 may include first and second division resistances 212 and 213, and third and fourth division resistances 232 and 233.

The first and second division resistances 212 and 213 may be electrically coupled between the first external power voltage VE1 and the ground voltage VSS. For example, the first and second division resistances 212 and 213 are coupled in series and the first division resistance 212 may be coupled to the first external power voltage VE1 and the second division resistance 213 may be coupled to the ground voltage VSS.

The first and second division resistances 212 and 213 may output the first division voltage CVE1 which is a fraction of the first external power voltage VE1. For example, the first division voltage CVE1 may be determined based on a first resistance ratio.

The third and fourth division resistances 232 and 233 may be electrically coupled between the second external power voltage VE2 and the ground voltage VSS. For example, the third and fourth division resistances 232 and 233 are coupled in series and the third division resistance 232 may be coupled to the second external power voltage VE2 and the fourth division resistance 233 may be coupled to the ground voltage VSS.

The third and fourth division resistances 232 and 233 may output the second division voltage CVE2 which is a fraction of the second external power voltage VE2. For example, the second division voltage CVE2 may be determined based on a second resistance ratio.

The first resistance ratio and the second resistance ratio may be set so that the level of the first division voltage CVE1 may be higher than the level of the second division voltage CVE2.

The first resistance ratio and the second resistance ratio may be set according to the levels of the first external power voltage VE1 and the second external power voltage VE2.

The first comparison portion 601 may use the first external power voltage VE1 as a power supply voltage, and may generate a first comparison signal CVE1_OUT by comparing the first division voltage CVE1 with the second division voltage CVE2.

The first comparison portion 601 may output the first comparison signal CVE1_OUT having a logic high level when the level of the second division voltage CVE2 is equal to or higher than the level of the first division voltage CVE1.

The second comparison portion 701 may use the second external power voltage VE2 as a power supply voltage, and may generate a second comparison signal CVE2_OUT by comparing the first division voltage CVE1 with the second division voltage CVE2.

The second comparison portion 701 may output the second comparison signal CVE2_OUT having a logic high level when the level of the second division voltage CVE2 is equal to or higher than the level of the first division voltage CVE1.

The first comparison portion 601, which is provided with the first external power voltage VE1, generates the first comparison signal CVE1_OUT by comparing the first division voltage CVE1 and the second division voltage CVE2.

The second comparison portion 701, which is provided with the second external power voltage VE2, generates the second comparison signal CVE2_OUT by comparing the first division voltage CVE1 and the second division voltage CVE2. The first and second comparison portions 601 and 701, which are provided with the first and second external power voltages VE1 and VE2, respectively, generate the first and second comparison signals CVE1_OUT and CVE2_OUT, respectively. Therefore, the difference between the first and second comparison signals CVE1_OUT and CVE2_OUT may reflect the difference between the first and second external power voltages VE1 and VE2.

The power-up signal generation portion 501 may generate a power-up signal POWERUP in response to the first comparison signal CVE1_OUT and the second comparison signal CVE2_OUT.

The power-up signal generation portion 501 may activate the power-up signal POWERUP when both of the first comparison signal CVE1_OUT and the second comparison signal CVE2_OUT are activated.

The power-up signal generation portion 501 may include a NAND gate 511, and an inverter 521.

The power-up operation of a semiconductor apparatus, which uses the first external power voltage VE1 and the second external power voltage VE2 in its internal operations, may be performed according to the power-up signal POWERUP.

Figure 3:
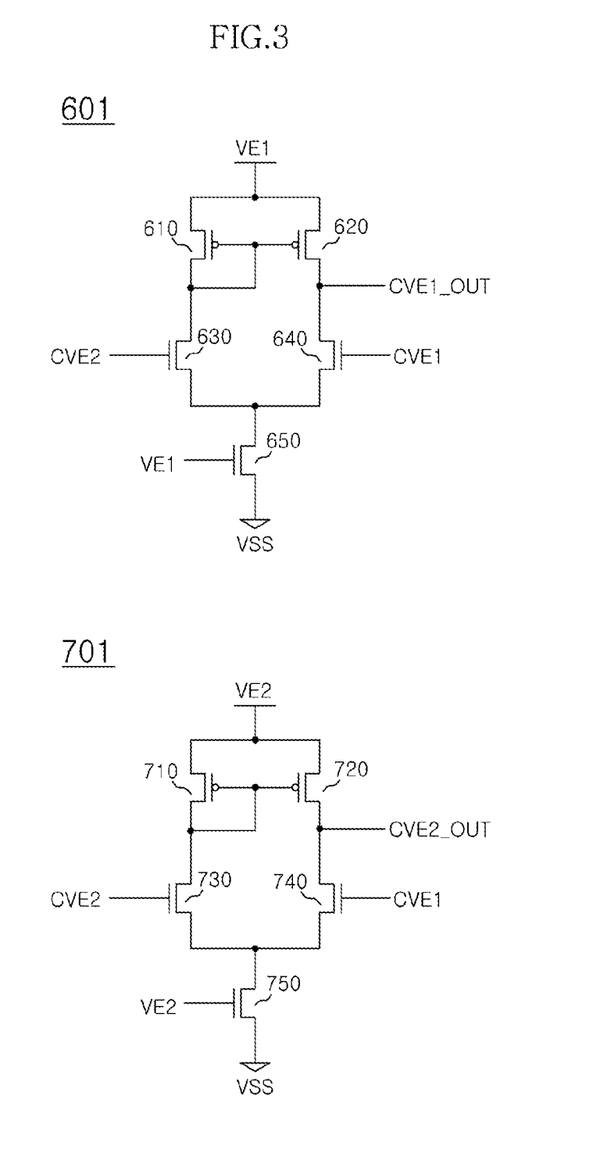
FIG. 3 is a circuit diagram illustrating a first comparison portion and a second comparison portion.

Referring to FIG. 3, the first comparison portion 601 may include first to fifth transistors 610 to 650.

The first transistor 610 may receive the first external power voltage VE1 at its source, and a drain and a gate thereof may be electrically coupled to each other.

The second transistor 620 may be electrically coupled to the source of the first transistor 610 at its source, and to the gate of the first transistor 610 at its gate.

The third transistor 630 may be electrically coupled to the drain of the first transistor 610 at its drain, and may receive the second division voltage CVE2 at its gate.

The fourth transistor 640 may be electrically coupled to the drain of the second transistor 620 at its drain, and may receive the first division voltage CVE1 at its gate.

The fifth transistor 650 may be electrically coupled in common to sources of the third transistor 630 and the fourth transistor 640 at its drain, may receive the first external power voltage VE1 at its gate, and may be electrically coupled to the ground voltage VSS at its source.

The second comparison portion 701 may include first to fifth transistors 710 to 750.

The first transistor 710 may receive the second external power voltage VE2 at its source, and a drain and a gate thereof may be electrically coupled to each other.

The second transistor 720 may be electrically coupled to the source of the first transistor 710 at its source, and to the gate of the first transistor 710 at its gate.

The third transistor 730 may be electrically coupled to the drain of the first transistor 710 at its drain, and may receive the second division voltage CVE2 at its gate.

The fourth transistor 740 may be electrically coupled to the drain of the second transistor 720 at its drain, and may receive the first division voltage CVE1 at its gate.

The fifth transistor 750 may be electrically coupled in common to sources of the third transistor 730 and the fourth transistor 740 at its drain, may receive the second external power voltage VE2 at its gate, and may be electrically coupled to the ground voltage VSS at its source.

Figure 4:
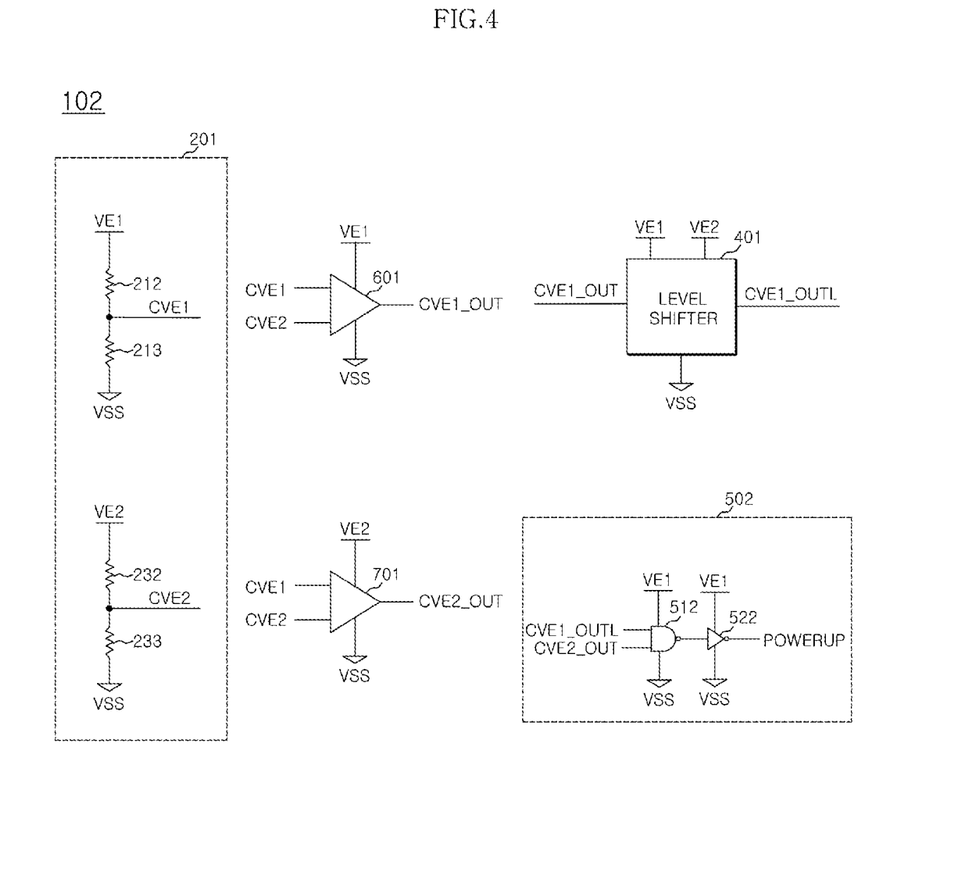
FIG. 4 is a circuit diagram illustrating a power-up circuit of a semiconductor apparatus in accordance with an embodiment.

Referring to FIG. 4, the power-up circuit 102 may include a voltage division portion 201, a first comparison portion 601, a second comparison portion 701, a level shifter 401, and a power-up signal generation portion 502.

The voltage division portion 201 may generate a first division voltage CVE1, which is a fraction of a first external power voltage VE1, and a second division voltage CVE2, which is a fraction of a second external power voltage VE2. For example, the first and second division voltages CVE1 and CVE2 may be determined based on their resistance ratios, respectively.

The voltage division portion 201 may include first and second division resistances 212 and 213, and third and fourth division resistances 232 and 233.

The first and second division resistances 212 and 213 may be electrically coupled between the first external power voltage VE1 and the ground voltage VSS.

The first and second division resistances 212 and 213 may output the first division voltage CVE1 which is a fraction of the first external power voltage VE1. For example, the first division voltage CVE1 may be determined based on a first resistance ratio.

The third and fourth division resistances 232 and 233 may be electrically coupled between the second external power voltage VE2 and the ground voltage VSS.

The third and fourth division resistances 232 and 233 may output the second division voltage CVE2 which is a fraction of the second external power voltage VE2. For example, the second division voltage CVE2 may be determined based on a second resistance ratio.

The first resistance ratio and the second resistance ratio may be set so that the level of the first division voltage CVE1 may be higher than the level of the second division voltage CVE2.

The first resistance ratio and the second resistance ratio may be set according to the levels of the first external power voltage VE1 and the second external power voltage VE2.

The first comparison portion 601 may use the first external power voltage VE1 as a power supply voltage, and may generate a first comparison signal CVE1_OUT by comparing the first division voltage CVE1 with the second division voltage CVE2.

The first comparison portion 601 may output the first comparison signal CVE1_OUT having a logic high level when the level of the second division voltage CVE2 is equal to or higher than the level of the first division voltage CVE1.

The second comparison portion 701 may use the second external power voltage VE2 as a power supply voltage, and may generate a second comparison signal CVE2_OUT by comparing the first division voltage CVE1 with the second division voltage CVE2.

The second comparison portion 701 may output the second comparison signal CVE2_OUT having a logic high level when the level of the second division voltage CVE2 is equal to or higher than the level of the first division voltage CVE1.

The first comparison portion 601, which is provided with the first external power voltage VE1, generates the first comparison signal CVE1_OUT by comparing the first division voltage CVE1 and the second division voltage CVE2.

The second comparison portion 701, which is provided with the second external power voltage VE2, generates the second comparison signal CVE2_OUT by comparing the first division voltage CVE1 and the second division voltage CVE2. The first and second comparison portions 601 and 701, which are provided with the first and second external power voltages VE1 and VE2, respectively, generate the first and second comparison signals CVE1_OUT and CVE2_OUT, respectively. Therefore, the difference between the first and second comparison signals CVE1_OUT and CVE2_OUT may reflect the difference between the first and second external power voltages VE1 and VE2. [For clarity, we changed the above sentence.]

The first comparison portion 601 and the second comparison portion 701 may be the same as described above with reference to FIG. 3.

The level shifter 401 may generate a level shift signal CVE_OUTL by shifting the level of the first comparison signal CVE1_OUT, for example, to the level of the second external power voltage VE2.

The level shifter 401 may generate the level shift signal CVE_OUTL when the level of the second external power voltage VE2 becomes stable. The level of the level shift signal CVE_OUTL may refer to a difference between the first external power voltage VE1 and second external power voltage VE2.

The power-up signal generation portion 502 may generate a power-up signal POWERUP in response to the level shift signal CVE_OUTL and the second comparison signal CVE2_OUT.

The power-up signal generation portion 502 may activate the power-up signal POWERUP when both of the level shift signal CVE_OUTL and the second comparison signal CVE2_OUT are activated.

The power-up signal generation portion 502 may include a NAND gate 512, and an inverter 522.

The activation of the level shift signal CVE_OUTL may mean that the voltage level of the first external power voltage VE1 has been reached a predetermined level and a difference between the voltage levels of the first external power voltage VE1 and the second external power voltage VE2 is a predetermined level.

The power-up signal POWERUP may be activated when each individual voltage level has been reached each predetermined level and differences between the multiple voltages are predetermined levels. For example, where a semiconductor device uses the first and second external power voltages VE1 and VE2, the power-up signal POWERUP may be activated when each voltage level of the first and second external power voltages VE1 and VE2 has been reached each predetermined level and a difference between the first and second external power voltages VE1 and VE2 is a predetermined level.

The power-up operation of a semiconductor apparatus, which uses the first external power voltage VE1 and the second external power voltage VE2 in its internal operations, may be performed according to the power-up signal POWERUP.

Figure 5:
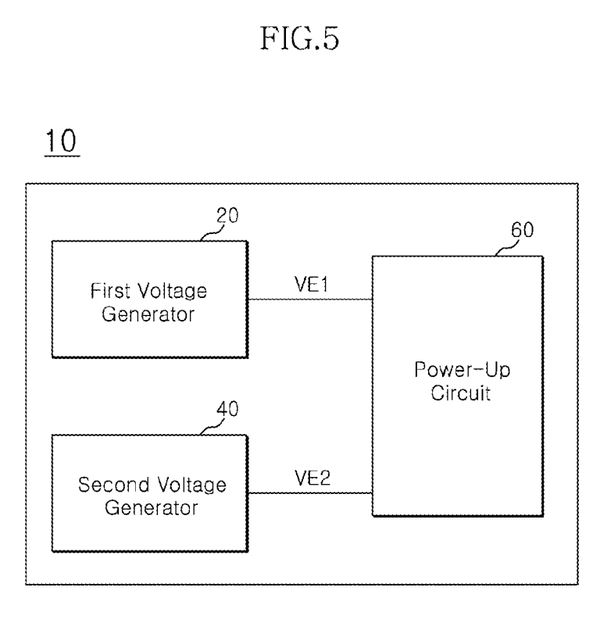
FIG. 5 is a circuit diagram illustrating a system having a component that requires power-up operation.

Referring to FIG. 5, the system 10 having a component that requires a power-up operation may include a first voltage generator 20, a second voltage generator 40, and a power-up circuit 60.

The component that requires the power-up operation may include a semiconductor memory device. In an embodiment, the semiconductor memory device may include the power-up circuit 60 therein. In the system where a plurality of voltage sources are used in the component that requires the power-up operation, the power-up operation may be performed on each voltage level with respect to the plurality of voltage sources. In an embodiment, whether or not the power-up operation has been completed may be determined not only by whether each individual voltage level has been reached each predetermined level but also by whether differences between the multiple voltages are predetermined levels. It is because deviations in differences of the multiple voltages may form unintended current path.

While certain embodiments have been described above, it will be understood to those skilled in the art that the embodiments described are by way of example only. Accordingly, the power-up circuit of a semiconductor apparatus should not be limited based on the described embodiments. Rather, the power-up circuit of a semiconductor apparatus described herein should only be limited in light of the claims that follow when taken in conjunction with the above description and accompanying drawings.

What is claimed is:

1. A power-up circuit of a semiconductor apparatus, comprising:
   a voltage division portion configured to generate a first division voltage, which is a fraction of a first external power, and a second division voltage, which is a fraction of a second external power voltage, obtained by voltage division based on a first resistance ratio and a second resistance ratio, respectively;
   a first comparison portion configured to use the first external power voltage as a power supply voltage, and to generate a first comparison signal by comparing the first division voltage with the second division voltage;
   a second comparison portion configured to use the second external power voltage as a power supply voltage, and to generate a second comparison signal by comparing the first division voltage with the second division voltage; and
   a power-up signal generation portion configured to generate a power-up signal in response to the first comparison signal and the second comparison signal.

2. The power-up circuit of a semiconductor apparatus of claim 1, wherein the first resistance ratio and the second resistance ratio are set according to the levels of the first external power voltage and the second external power voltage.

3. The power-up circuit of a semiconductor apparatus of claim 1, wherein the power-up signal generation portion activates the power-up signal when both of the first comparison signal and the second comparison signal are activated.

4. A power-up circuit of a semiconductor apparatus, comprising:
   a voltage division portion configured to generate a first division voltage, which is a fraction of a first external power, and a second division voltage, which is a fraction of a second external power voltage, obtained by voltage division based on a first resistance ratio and a second resistance ratio, respectively;
   a first comparison portion configured to use the first external power voltage as a power supply voltage, and to generate a first comparison signal by comparing the first division voltage with the second division voltage;
   a second comparison portion configured to use the second external power voltage as a power supply voltage, and to generate a second comparison signal by comparing the first division voltage with the second division voltage;
   a level shifter configured to generate a level shift signal by shifting the level of the first comparison signal to the level of the second external power voltage; and
   a power-up signal generation portion configured to generate a power-up signal in response to the level shift signal and the second comparison signal.

5. The power-up circuit of a semiconductor apparatus of claim 4, wherein the first resistance ratio and the second resistance ratio are set according to the levels of the first external power voltage and the second external power voltage.

6. The power-up circuit of a semiconductor apparatus of claim 4, wherein the power-up signal generation portion activates the power-up signal when both of the level shift signal and the second comparison signal are activated.

* * * * *